United States Patent [19]
Allen et al.

[11] Patent Number: 5,632,909
[45] Date of Patent: May 27, 1997

[54] FILTER

[75] Inventors: Donald E. Allen, Gilbert; Philip P. Kwan, Tempe; David P. Stumbo, Scottsdale, all of Ariz.

[73] Assignee: Motorola, Inc., Schaumburg, Ill.

[21] Appl. No.: 491,824

[22] Filed: Jun. 19, 1995

[51] Int. Cl.$^6$ ................................................ B44C 1/22
[52] U.S. Cl. ........................................ 216/41; 216/97
[58] Field of Search ........................... 156/643.1, 654.1, 156/657.1, 659.11, 662.1; 216/2, 40, 41–67, 76, 79, 80, 97–99

[56] References Cited

U.S. PATENT DOCUMENTS 5,091,051  2/1992  Greer .......................... 216/79 X
5,115,216  5/1992  Hikita et al. .................. 333/195

Primary Examiner—William Powell
Attorney, Agent, or Firm—Frederick M. Fliegel; Robert M. Handy

[57] ABSTRACT

A full duplex radio having improved properties is obtained by using asymmetric surface acoustic wave (SAW) filters, the filters are composed of series and parallel coupled SAW resonators. Asymmetry is obtained by covering either of the series or parallel resonators of each filter with a dielectric layer to increase the SAW coupling coefficient of the covered resonators relative to the uncovered resonators. The filters are desirably in pairs arranged with mirror image frequency asymmetry such that the steeper skirts of the frequency response are adjacent. Greater pass-bandwidths can be obtained without adverse affect on transmitter and receiver isolation.

6 Claims, 6 Drawing Sheets

FILTER

FIELD OF THE INVENTION

The present invention relates to means and methods for improved radios and filters, and more particularly, improved radios and filters employing Surface Acoustic Wave (SAW) devices.

BACKGROUND OF THE INVENTION

Surface acoustic wave (SAW) devices are much used today in electronic communication, especially SAW devices arranged to provide filtering functions. Filters formed from SAW devices are particularly useful in connection with portable radio and telephones. Such radios telephones operate typically in the 500–1500 MHz range and higher.

Filter characteristics that are of particular interest to the radio designer are: (a) the pass-bandwidth, that is, the range of frequencies within which the filter passes a signal with acceptable loss, (b) the pass-band attenuation, that is, how much loss occurs in the pass-band, (c) the transition bandwidth, that is, the range of frequencies which separate the pass-band and the stop-band, and (d) the stop-band attenuation, that is, the attenuation outside the pass-band and transition-band where no signal is desired to be transmitted. The stop band is the frequency region in which the filter provides very high attenuation. The transition band is the frequency region in which the attenuation rapidly increases from a low value (little attenuation) at the corner frequency of the pass-band to a high value (large attenuation) in the stop-band. The transition band is also referred to in the art as the "skirt" of the filter transfer characteristic, e.g., the fall-off region on either side of the pass-band on a plot of filter attenuation versus frequency.

It is a feature of SAW filters that the widths of the pass-band and transition-band are related. The choice and cut of piezoelectric substrate material from which the SAW filter is constructed and the electrode shape, spacing and location influence the characteristics of the SAW filter. Design modifications which cause the pass-band to increase in width generally also cause the transition-bandwidth to increase. Conversely, those choices which allow one to obtain small transition-bandwidths also yield narrow pass-bandwidths. This makes it extremely difficult to design SAW filters which simultaneously provide a relatively wide pass-bandwidth but at the same time have very narrow transition-bandwidths, that is, steep skirts on the filter transfer characteristic.

It is an advantage of the present invention that it overcomes these limitations of the prior art so that a greater pass-bandwidth is obtained while preserving a narrow transition-bandwidth (steep skirt) on at least one side of the pass-band. Such a SAW filter is advantageously used to improve the properties of radios.

DETAILED DESCRIPTION OF THE PREFERRED EMBODIMENT

Figure 1:
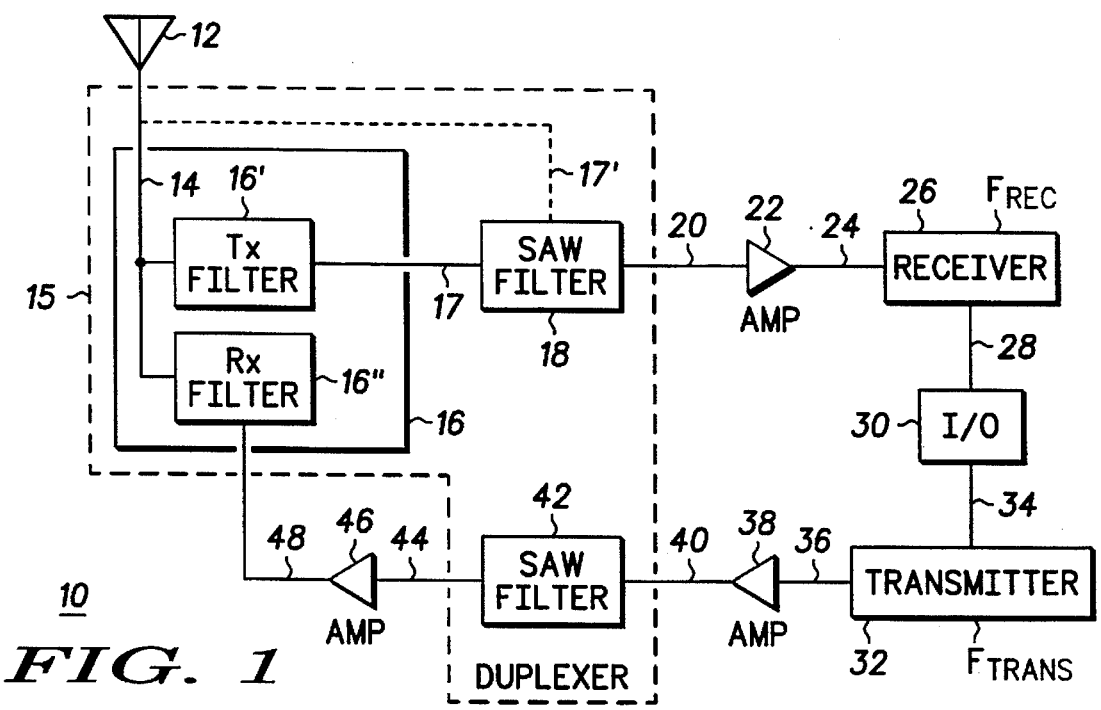
FIG. 1 is a schematic block diagram of a radio utilizing one or more improved SAW filters of the present invention.

FIG. 1 is a schematic block diagram of radio 10 embodying one or more improved SAW filters according to the present invention. Radio 10 comprises antenna 12 which is coupled by line 14 to Transmit/Receiver (T/R) filter 16. The purpose of T/R filter 16 is to help provide isolation between receive frequencies ($F_{rec}$) and transmit frequencies ($F_{trans}$) so that duplex communication can occur, i.e., simultaneous reception and transmission.

T/R filter 16 conveniently has two sub-portions, T/R receive filter 16' and T/R transmit filter 16". Filter 16' is tuned to pass the receive frequencies $F_{rec}$ to line 17 and receive channel SAW filter 18 while attenuating transmit frequencies $F_{trans}$ coming from line 48 and transmit power amplifier 46. Filter 16" is tuned to pass the transmit frequencies ($F_{trans}$) on line 48 from transmit power amplifier 46 and attenuate any sidebands generated within amplifier 46 that might overlap $F_{rec}$. T/R filter 16 can comprise one or both of sub-filters 16', 16". For example, when T/R filter 16' is omitted, receive SAW filter 18 is coupled directly to antenna lead 14 as shown by alternative lead 17'. In this circumstance, T/R filter 16 contains only filter 16" tuned to $F_{trans}$.

The incoming signal is passed via lines 17 or 17' to receive SAW filter 18 which is coupled by line 20 to pre-amplifier 22 which is in turn coupled by line 24 to receiver 26. Receiver 26 demodulates the amplified incoming signal and delivers it via line 28 to input/output (I/O) device 30 which includes for example, an annunciator or other digital or analog output device. In a communications transceiver intended for voice communications, I/O device 30 will generally include a microphone, speaker or headphone, display and other conventional circuitry for volume control and signal processing. When digitized voice transmission is employed, I/O device 30 will also generally include a CODEC. Persons of skill in the art will understand that many different functions can be included in I/O device 30 depending upon the nature of the information desired to be received and transmitted. Non-limiting examples of different types of information are voice, video, fax and data.

I/O device 30 is coupled to transmitter section 32 by line 34 so that signals originating within I/O device 30 can be broadcast by radio 10. The output of transmitter section 32, usually comprising a modulated radio frequency (RF) signal, is coupled via line 36 to pre-amplifier 38 and via line 40 to transmit SAW filter 42, and thence by line 44 to final power amplifier 46, by line 48 to T/R filter 16, and then by lead 14 to antenna 12 from which the signal provided by I/O device 30 is transmitted in radio frequency (RF) modulated form to another radio. Any form of modulation or coding well known in the art may be employed by radio 10. Radio 10 is distinguished from the prior art by, among other things, the properties of filters 16, 18 and/or 42 which are described in more detail below. Filters 16, 18, 42 can be formed as separate SAW filters or can be on a common substrate as indicated by dashed line 15 or a combination thereof.

Figure 2:
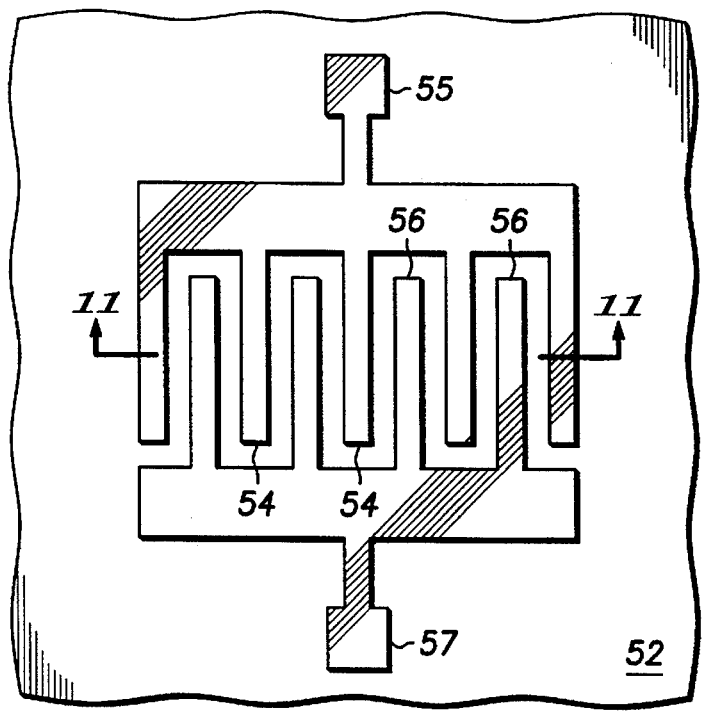
FIG. 2 is a simplified schematic top view of an elemental portion of a SAW filter, illustrating a SAW electrode structure in simplified form.

FIG. 2 is a simplified schematic top view of elemental SAW resonator or device 50 which is used to form a SAW filter. Elemental SAW resonator 50 comprises piezoelectric substrate 52 on which are formed interleaved electrodes 54, 56 having, respectively, connection points 55, 57. Substrate 52 may be made of any piezoelectric material, but quartz, lithium niobate and lithium tantalate are particularly useful. Crystals of these materials cut at different angles are employed, according to techniques well known in the art. Electrodes 54, 56 are conveniently formed of aluminum but other conductive materials can also be employed. Fabrication techniques for forming SAW resonators of predetermined frequency response are well known in the art.

Figure 3:
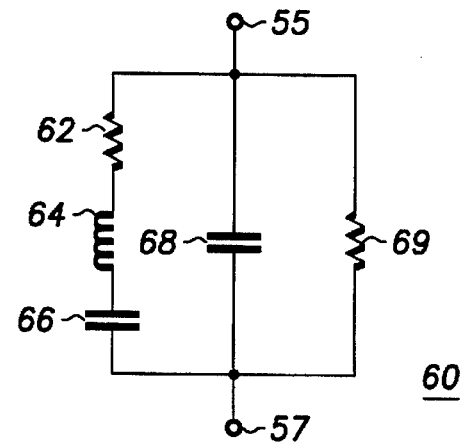
FIG. 3 is a simplified electrical equivalent circuit of the physical structure of FIG. 2.

FIG. 3 shows simplified electrical equivalent circuit 60 of elemental SAW resonator or device 50 of FIG. 2. Circuit 60 has connections 55, 57 corresponding to the like identified connection points of device 50 of FIG. 2. Circuit 60 comprises series resistance 62, inductance 64 and capacitance 66, parallel capacitance 68 and parallel resistance 69. Resistances 62, 69 account for the signal loss encountered in the pass-band of the SAW device. Persons of skill in the art will understand that elemental SAW device 50 represented by equivalent circuit 60 has a series resonant frequency ($f_r$) at which the impedance between terminals 55, 57 becomes very small and a parallel resonant frequency ($f_a$), also referred to as the "anti-resonant" frequency, where the impedance between terminals 55, 57 is very large. In general, $f_a > f_r$.

Figure 4:
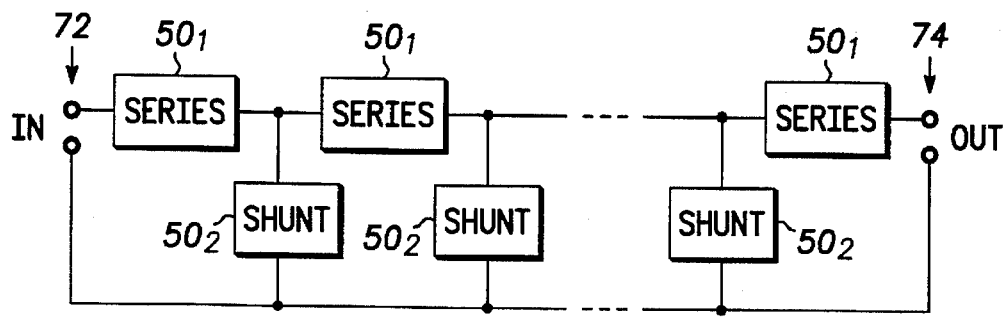
FIG. 4 illustrates in simplified form, how multiple elemental structures of FIGS. 2–3 are combined in a series-parallel arrangement to produce a SAW filter.
Figure 5:
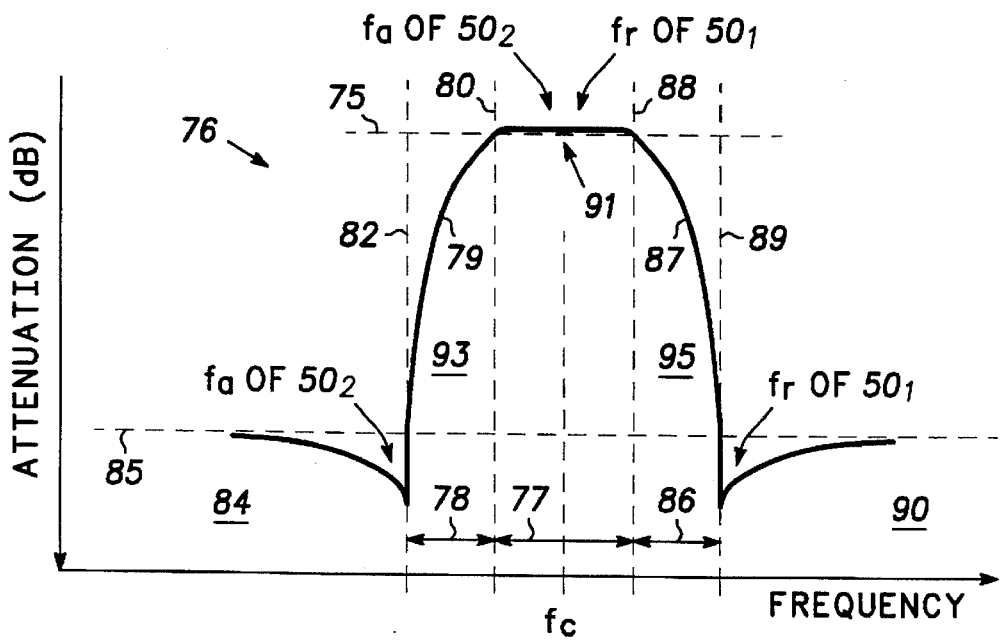
FIG. 5 shows an illustrative SAW filter transfer characteristic for the structure of FIG. 4 wherein the SAW coupling coefficients of the series and parallel resonators are substantially the same.

FIG. 4 illustrates in simplified form, SAW filter 70 with input 72 and output 74, formed from multiple repetitions of similar SAW resonators or devices 50, arranged in series-parallel connection. Series connected resonators are denoted by the reference numbers 50s and parallel (i.e., shunt) connected resonators are denoted by the reference numbers 50p. FIG. 5 shows attenuation versus frequency transfer characteristic 76 of SAW filter 70. Each of series elements 50s and parallel elements 50p are formed from resonator 50 of FIG. 2. Individual series resonators 50s and parallel resonators 50p can be tuned to slightly different frequencies to vary the shape of transfer characteristic 76. Persons of skill in the art will understand based on techniques well known in the art how to choose the number of series-parallel stages and their individual values of $f_a$ and $f_r$ needed to achieve a desired pass-bandwidth and stop-bandwidth. It is often desirable to set $f_a$ of shunt resonators 50p about equal to $f_r$ of series resonators 50s, as indicated at the top of FIG. 5. These resonances substantially determined the frequency of the pass-band of the filter.

Transfer characteristic 76 has pass-band 91 of pass-bandwidth width 77 wherein attenuation is less than a predetermined amount indicated by horizontal dashed line 75. Transfer characteristic 76 has lower transition band 93 of bandwidth 78 corresponding to lower transition or skirt 79 between lower pass-band corner frequency 80 and lower stop-band edge frequency 82 where the attenuation exceeds predetermined level 85. Frequency 82 corresponds approximately to $f_r$ of parallel resonators 50p. Stop-band 84 lies below frequency 82.

Transfer characteristic 76 has upper transition band 95 of bandwidth 86 corresponding to upper transition or skirt 87 between upper pass-band corner frequency 88 and upper stop-band edge frequency 89 where the attenuation exceeds predetermined level 85. Frequency 89 corresponds approximately to $f_a$ of series resonators 50s. Stop-band 90 lies above frequency 89.

In the case of SAW filters composed of multiple SAW resonators 50 of the type shown in FIG. 2, pass-band width 77 and transition bandwidths 78, 86 are related and dependent on the SAW coupling coefficient $K^2$, where $K^2$ is a property of the substrate material. Choosing a value of $K^2$ which increases pass-bandwidth 77, also increases transition bandwidths 78, 86. Choosing a lower value of $K^2$ (e.g., by changing the material or cut) will make the transition bandwidths 78, 86 smaller, but also narrow pass-bandwidth 77. Choosing larger values of $K^2$ has the opposite effect, that is, widening both pass-bandwidth 77 and the transition-bandwidths 78, 86. Thus, the designer of conventional SAW filters is often frustrated by conflicting requirements for wide pass-bandwidths and narrow transition-bandwidths. This is especially important in connection with radios where SAW filters are desired to be used to prevent spurious signals from the transmitter section from interfering with the receiver section of a full-duplex radio, such as is illustrated in FIG. 1.

Figure 6:
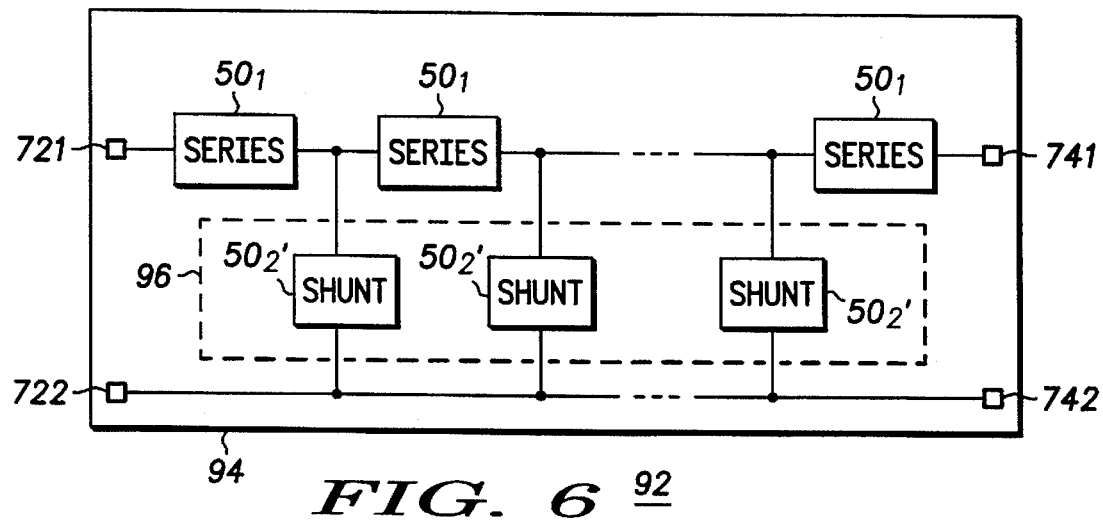
FIG. 6 is a simplified plan view of a SAW filter according to the present invention wherein elemental devices of FIGS. 2–3 are arranged in series-parallel combination and the parallel resonators are modified to increase their SAW coupling coefficient.

The above-noted difficulties are overcome by making the effective coupling coefficients $K^2$ different for different portions of the filter of FIG. 4. How this is done is illustrate in FIGS. 6–14. FIG. 6 is a simplified plan view of SAW filter 92 according to a first embodiment of the present invention wherein elemental devices or resonators of FIGS. 2–3 are arranged in series-parallel combination (similar to the arrangement described in connection with FIG. 4) but with the parallel resonators 50p modified to increase their effective SAW coupling coefficient $K^2$. Resonators 50s or 50p which have been modified to increase their coupling coefficients are identified by addition of a prime symbol, as in 50s' or 50p'.

Filter 92, with input electrodes 721, 722 and output electrodes 741, 742, is formed on piezoelectric substrate 94 such as has already been described. Filter 92 comprises multiple series coupled resonators 50s and multiple parallel coupled resonators 50p', each analogous to elemental device 50, except that parallel resonators 50p' have been modified to have larger values of $K^2$ than the associated series resonators 50s. This is conveniently accomplished by overlying parallel resonators 50p with dielectric layer 96 (see also FIG. 11). Dielectric layer 96 is conveniently an insulating material such as $SiO_2$ or $TiO_2$ or $Al_2O_3$ or $MgO$ or $SiO$ or $Si_3N_4$ or $Ta_2O_5$ or $ZnO$ or combinations thereof or other doped or undoped III-V or II-VI compounds well known in the art. Other insulating or semi-insulating materials may also be used provided that their presence does not short electrodes 54, 56 (see FIG. 2). Layer 96 need not be of a piezoelectric material. As used herein, the term "glass" is intended to include any and all of the above-listed and equivalent materials.

Placing glass layer 96 on top of parallel resonators 50p has the effect of increasing the effective value of $K^2$ for those resonators while leaving the series resonators unaffected. The resonant frequencies of the transducers covered by glass layer 96 will, in general, be shifted slightly from their un-covered values. However, persons of skill in the art can readily determined the magnitude of the expected shift depending upon the amount and physical properties of the glass being used so that values of $f_a$ and $f_r$ for the resonators prior to covering them with glass can be offset. In this way $f_a$ and $f_r$ obtained after covering the resonators with layer 96 will have the desired values.

Figure 7:
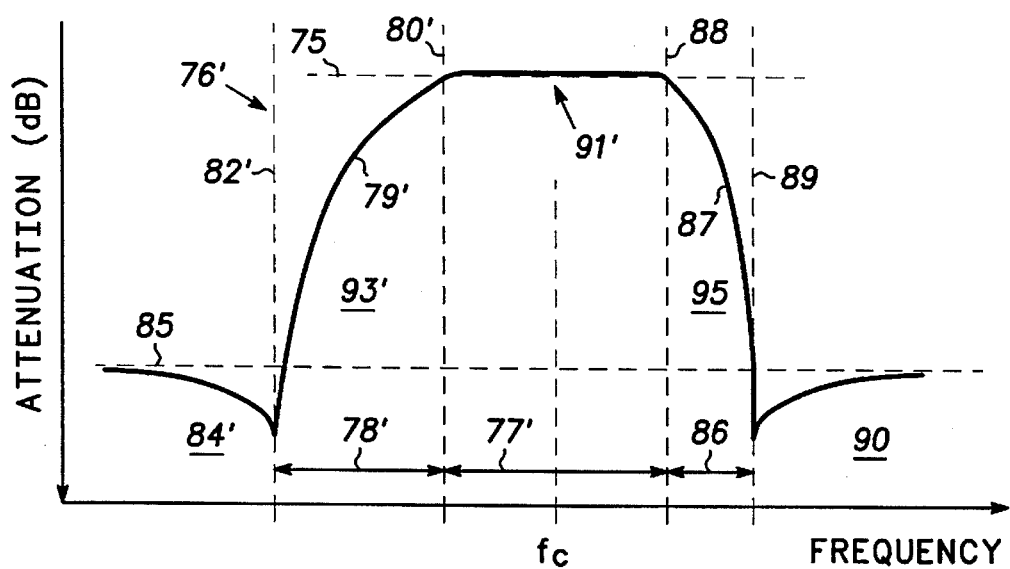
FIG. 7 shows an illustrative SAW filter transfer characteristic for the structure of FIG. 6.

FIG. 7 shows an illustrative SAW filter transfer characteristic 76' for the structure of FIG. 6. Upper stop-band 90, upper attenuation frequency 89, upper transition width 86 and upper band-pass corner frequency 88 are, relatively, undisturbed. In particular, transition bandwidth 86 is substantially the same as for filter 70. However, the presence of layer 96 on parallel resonators 50p' provides pass-band 91' of larger pass-bandwidth 77' and transition-band 93' of larger transition bandwidth 78'. Lower pass-band corner frequency 80', and lower stop-band corner frequency 82' and stop-band 84' are moved to lower frequencies. Filter 92 provides a significant improvement over prior art filters where it is being used to filter out a powerful signal source which is higher in frequency than the filter pass-band, without sacrifice of pass-bandwidth. Thus, filter 92 is useful in radio 10 as filter 16' and/or 18 where $f_{trans}$ is above $f_{rec}$ or as filter 16" and/or 42 where the $f_{rec}$ is above $f_{trans}$ (see FIG. 14).

Figure 8:
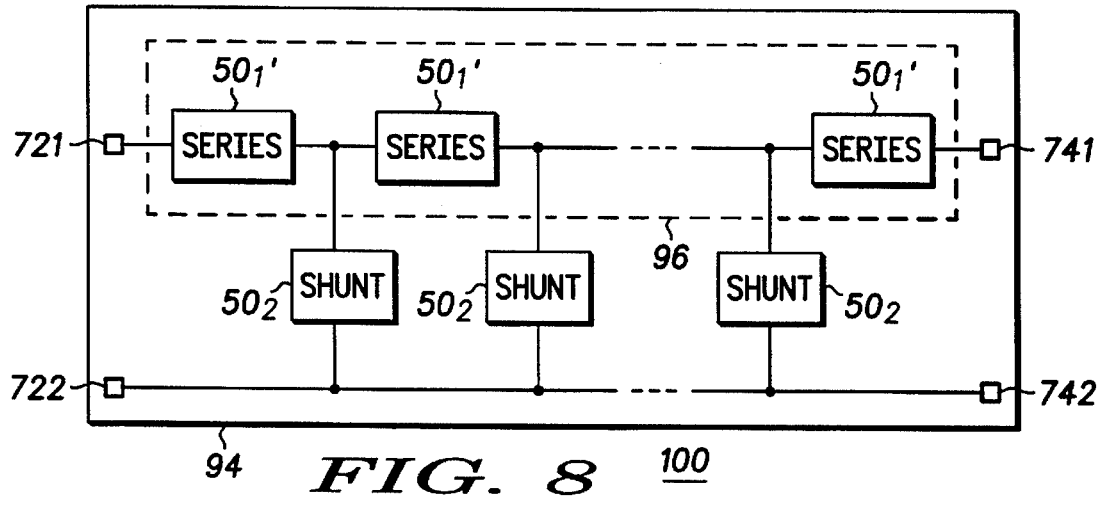
FIG. 8 is a simplified plan view of a SAW filter similar to that of FIG. 6 but wherein the series resonators are modified to increase their SAW coupling coefficient.

FIG. 8 is a simplified plan view of SAW filter 100 similar to SAW filter 92 of FIG. 6 but wherein series resonators 50s are modified to increase their SAW coupling coefficients, i.e., as 50s'. SAW filter 100 with input connection 721, 722 and output connections 741, 742 has parallel elements 50p and series elements 50s' wherein series elements 50s' are similar to elements 50s in FIG. 6 but modified by the addition of layer 96 (see FIG. 11) in substantially the same way as in connection with elements 50p' of FIG. 6. The effect of providing layer 96 is to increase the coupling coefficients $K^2$. This has an effect shown in FIG. 9 which illustrates transfer characteristic 76" corresponding to filter 100.

Transfer characteristic 76" has lower stop-band 84, lower stop-band corner frequency 82, lower transition skirt 79 and lower transition-band 93 of bandwidth 78, analogous to that in FIG. 5, with transition bandwidth 78 substantially the same. Increasing the effective coupling coefficient $K^2$ of series elements 50s' has the effect of raising upper pass-band corner frequency 88", upper stop-band corner frequency 89" and stop band 90". Thus, passband 91" has increased bandwidth 77" and transition band 95" has greater bandwidth 86". Filter 100 provides a significant improvement over prior art filters where it is used to filter out a powerful signal source which is lower in frequency than the filter pass-band, without sacrifice of pass-bandwidth. Thus, filter 100 is useful in radio 10 as filter 16' and/or 18 where $f_{trans}$ is below $f_{rec}$ or as filter 16" and/or 42 where the $f_{rec}$ is below $f_{trans}$ (see FIG. 14).

Figure 9:
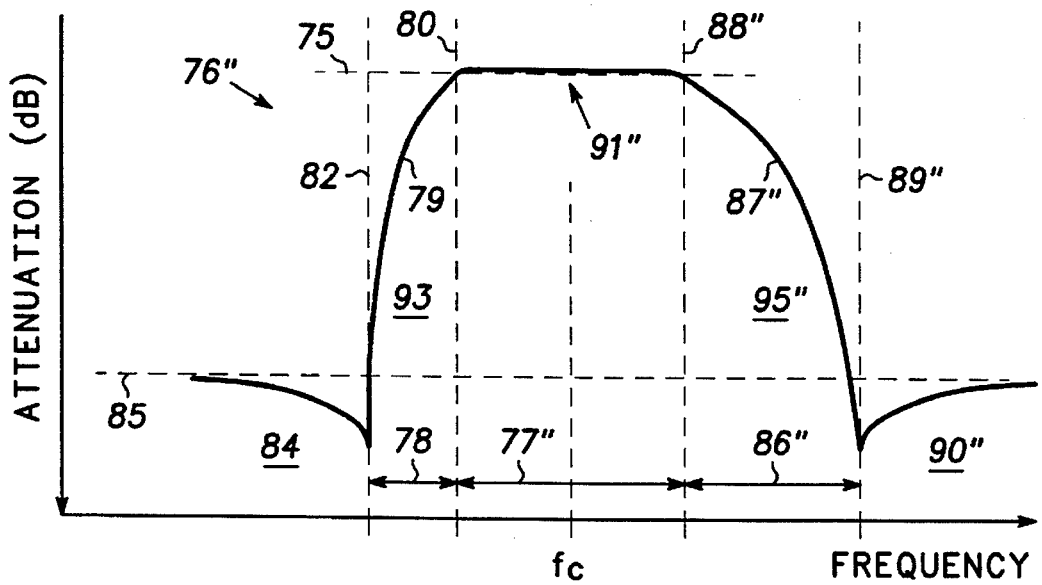
FIG. 9 shows an illustrative SAW filter transfer characteristic for the structure of FIG. 8.
Figure 10:
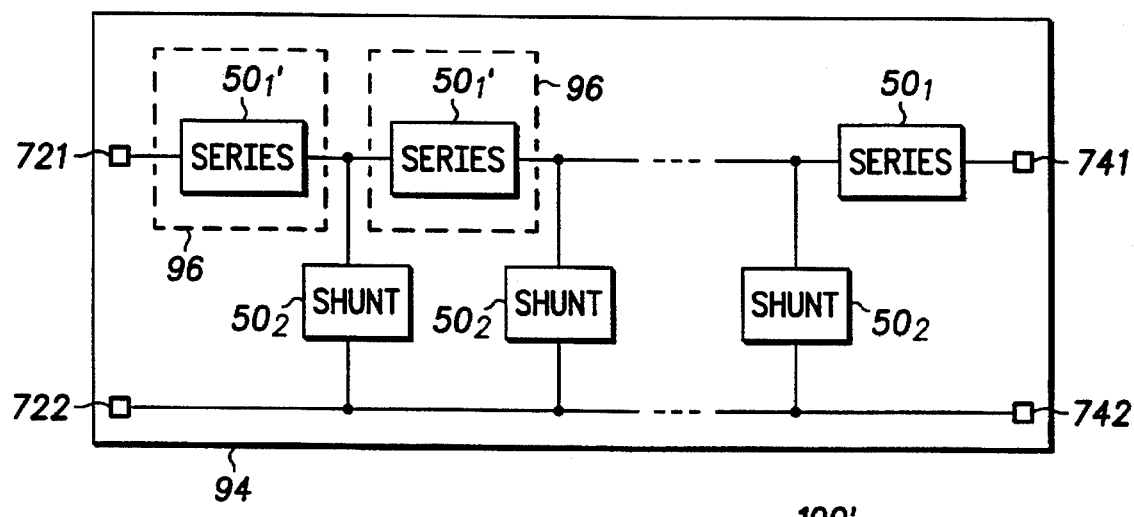
FIG. 10 shows a structure similar to that illustrated in FIG. 8 but where only a portion of the series resonators have been modified.

FIG. 10 is analogous to FIG. 8 except that filter 100' has only some of series elements 50s' covered by layer 96 so as to provide properties intermediate between those of filter 70 (FIGS. 6, 7) and filter 100 (FIGS. 8, 9). The number of series resonators to be provided with the increase in $K^2$ will depend upon the particular characteristic desired by the user.

While the modifications to filters 92, 100 relative to filter 70 have been described in terms of raising $K^2$ of certain series or parallel resonators, those of skill in the art will understand based on the description herein that while the described arrangement is particularly convenient, what is important is providing a difference of $K^2$ values between the series resonators and the parallel resonators of the same filter. This can be accomplished by either raising or lowering $K^2$ values of series resonators relative to parallel resonators or vice-versa so that a difference exists.

Figure 11:
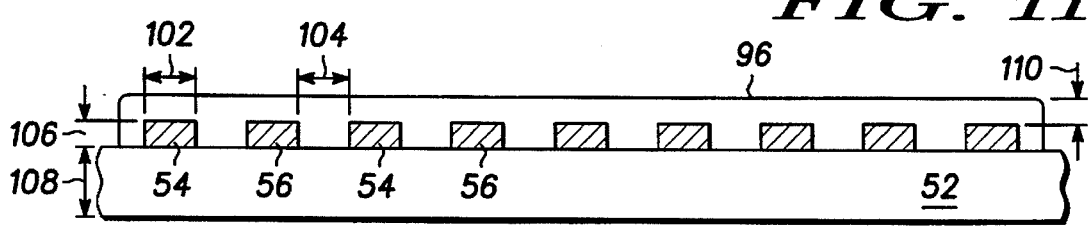
FIG. 11 shows a simplified cross-section through the elemental device of FIG. 2 illustrating how the SAW coupling coefficient of a SAW resonator is modified by use of an overlayer above the electrode fingers.

FIG. 11 shows a simplified cross-sectional view of resonator 50 of FIG. 2 illustrating how layer 96 interacts with electrode fingers 54, 56. In a typical device intended for operation in the range of about 700–1000 MHz and more typically about 945 MHz (e.g., an acoustic wavelength about 4 microns), electrode fingers 54, 56 have width 102 of about 25% of the acoustic wavelength, spacings of about 25% of the acoustic wavelength, and thickness 106 of about 0.1–0.15 microns, but larger or smaller values can also be used. Substrate 52 typically has a thickness 108 in the range of about 0.5 mm, more or less. Thickness 110 of layer 96 is conveniently about 10%–75% of the acoustic wavelength with about 25% being preferred. Layer 96 need not be substantially uniform in thickness although this is preferred.

Figure 12:
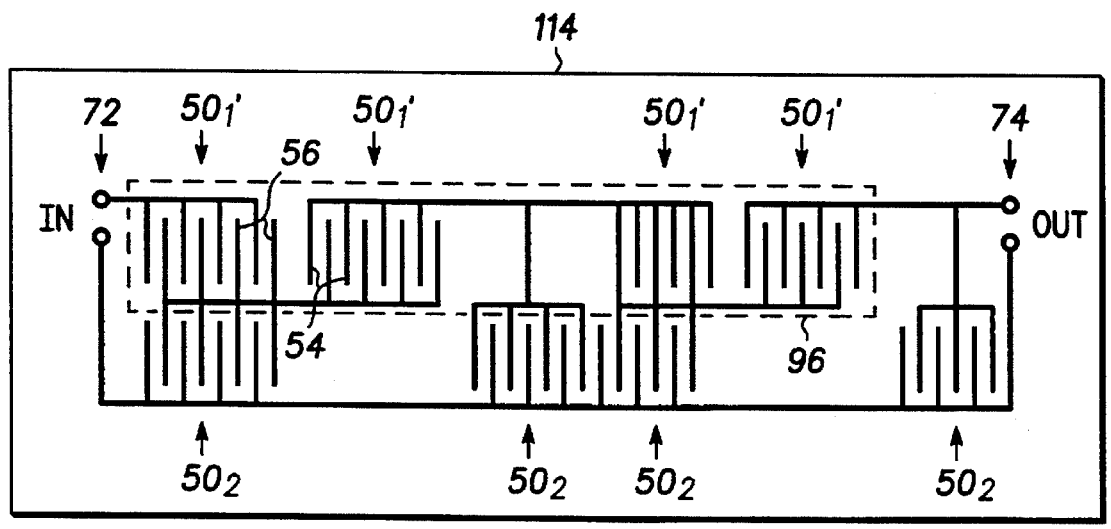
FIG. 12 shows a simplified plan view of the electrode fingers of multiple elemental resonators as in FIG. 2, coupled to form a device similar to that shown in FIGS. 4, 6, 8, 10, but with a coupling coefficient modification analogous to that shown in to FIG. 8.

FIG. 12 shows filter 112 illustrating in greater detail how electrodes 54, 56 of elemental structures 50s, 50p are conveniently arranged on substrate 114 and coupled to form a ladder structure analogous to that shown in FIGS. 4, 6, 8, 10, but with the coupling coefficient modification analogous to that of FIG. 8, i.e., series resonating elements covered by layer 96. It will be apparent from FIG. 12 that a very compact structure can be obtained by appropriate arrangement of electrodes 54, 56 into series devices 50s' and parallel devices 50p so that common lines are shared. This arrangement can also be used to construct the other filters described herein with different ones of the series (50s) or parallel (50p) resonators modified to have different values of $K^2$.

Figure 13:
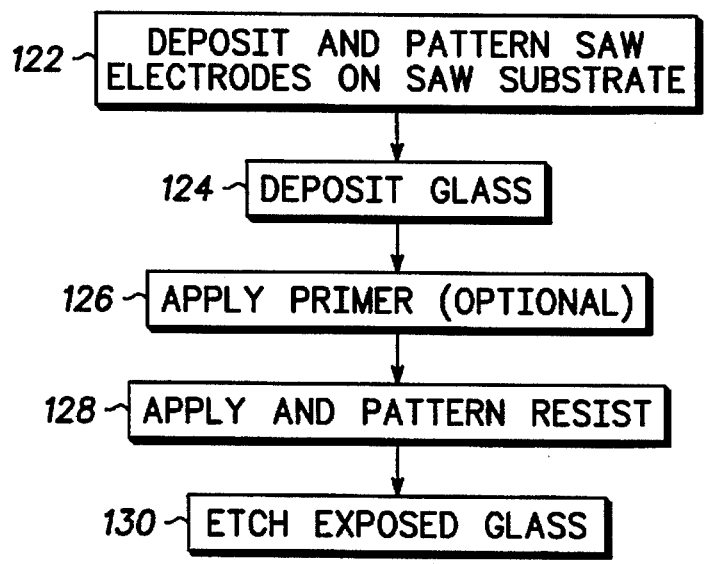
FIG. 13 is a simplified flow chart illustrating the process of manufacture of the improved SAW device of the present invention.

FIG. 13 shows flow chart 120 illustrating the practice of the method of the present invention for forming the filters described herein. In step 122, a substrate wafer containing multiple SAW devices is prepared in a conventional way using means well known in the art. The SAW electrodes are deposited and patterned. In step 124 a glass, such as has been previously described, is deposited over the electrode structure. This deposition may be localized using shadow masks so as to fall only on the desired areas or as is assumed in flow chart 120, deposited substantially uniformly over the whole area. Optional step 126 is provided where the nature of the chosen glass makes it desirable to provide a "priming" coating to increase the adhesion of the masking material (e.g., a photoresist) to the glass. In step 128 the etch resist is applied and patterned using conventional techniques and developed to expose those areas where, usually, glass material is desired to be removed. In step 130, the exposed glass is removed and the remaining resist stripped. While the above-described procedure is particularly convenient, those of skill in the art will understand based on the description herein that there are other techniques by which selected transducers in the series-parallel array may be covered with a layer to increase the coupling coefficient of such transducer and thereby modify their resonant frequencies to obtain the transfer characteristics described above. A non-limiting example is lift-off techniques well known in the art.

Figure 14:
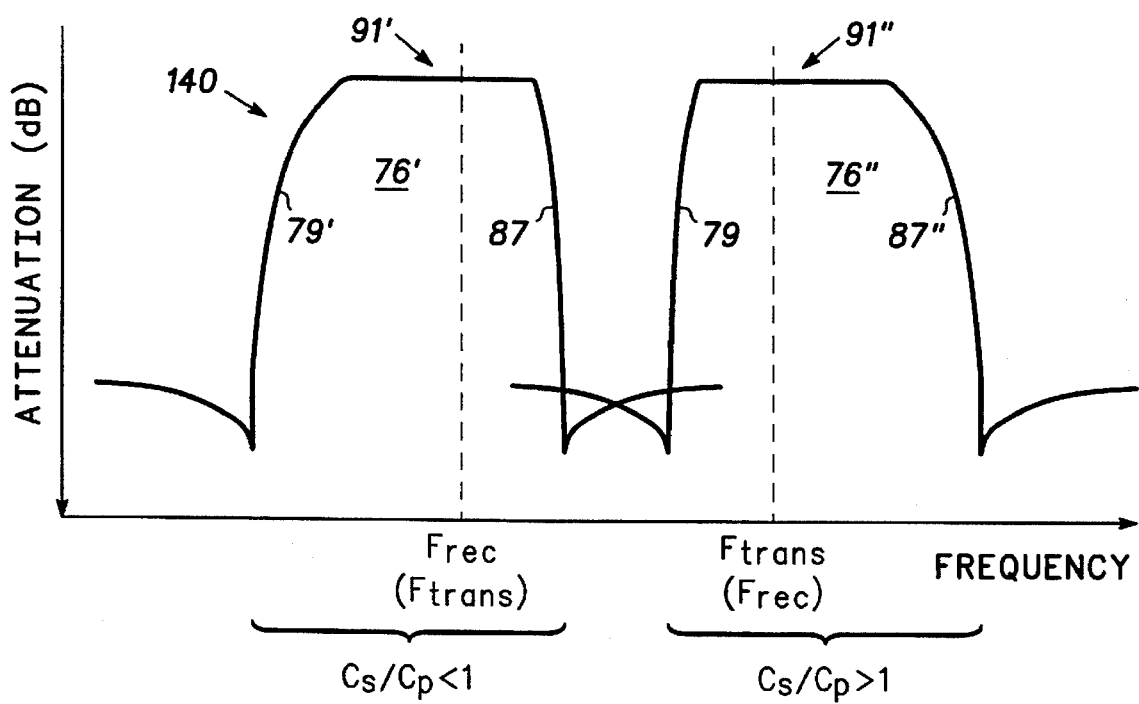
FIG. 14 is a plot of attenuation versus frequency for two SAW filters, one having a response of the type illustrated in FIG. 7 and the other having a response of the type illustrated in FIG. 9, showing how they are arranged in frequency to simultaneously provide broader bandwidths and high isolation between closely spaced interfering signals.

FIG. 14 is a plot of transfer characteristic 140 (i.e., attenuation vs. frequency) for two SAW filters 92, 100 according to the present invention, one having response 76' of the type illustrated in FIG. 7 and the other having response 76" of the type illustrated in FIG. 9. FIG. 14 shows how combined pass-bands 91', 91" are arranged in relative frequency for operation in radio 10. Pass-band 91' is arranged to be lower in frequency than pass-band 91", with, for example, pass-band 91' centered on receiver frequency $F_{rec}$ and pass-band 91" centered on transmitter frequency $F_{trans}$ of duplex radio 10 (note that the relative frequency of the transmitter and receiver can be interchanged). This places comparatively steep skirt portions 87, 79 closest together in frequency and more gradual skirt portions 79", 87" furthest apart in frequency.

Assuming that $F_{rec} < F_{trans}$, then filters 16' and 18 of radio 10 of FIG. 1 are desirably of type 92 illustrated in FIGS. 6–7 and filters 16", 42 are desirably of type 100 illustrated in FIGS. 8–9. Conversely, assuming that $F_{trans} F_{rec}$, then filters 16', 18 of radio 10 of FIG. 1 are desirably of type 100 illustrated in FIGS. 8–9 and filters 16", 42 are desirably of type 92 illustrated in FIGS. 6–7. Transfer characteristic 140 illustrated in FIG. 14 is highly desirable for construction of duplex radios of improved performance.

Another manner of comprehending the present invention is to consider the relative coupling coefficient $C=K^2$ of the resonators where $C_s$ represents the $K^2$ values of the series resonators 50s and $C_p$ represents the $K^2$ values of the parallel resonators 50p. Thus, in approximate terms: (i) for filter 70 with transfer characteristic 76, $C_s=C_p$ so that $C_s/C_p=1$; for filter 92 with transfer characteristic 76', $C_s<C_p$ so that $C_s/C_p<1$; and for filter 100 with transfer characteristic 76", $C_s>C_p$ so that $C_s/C_p>1$. Accordingly, then transfer characteristics of the filters used in radio 10 and shown in FIG. 14 can be expressed as using for the lower of $F_{rec}$ or $F_{trans}$ a filter with $C_s/C_p<1$ and using for the higher of $F_{rec}$ or $F_{trans}$ a filter with $C_s/C_p>1$. It can be seen from FIGS. 1 and 14 that when $F_{rec}/F_{trans}<1$, receive SAW filters 16', 18 should have $C_s/C_p<1$ and transmit SAW filters 16", 42 should have $C_s/C_p>1$. Conversely, when $F_{trans}/F_{rec}<1$, then transmit SAW filters 16", 42 should have $C_s/C_p<1$ and receive SAW filters 16', 18 should have $C_s/C_p>1$.

By now it will be appreciated that there has been provided an improved means and method for radios embodying SAW filters of improved properties and improved SAW filters themselves. The improved devices provide in the same filter comparatively wider pass-bandwidths while at the same time preserving the steepness of the low-high attenuation transition zone in the transfer characteristic on one side of the pass-band while allowing the transition zone on the opposite side of the pass-band to become less steep, where such decrease in steepness does not adversely affect radio performance. It will be further apparent based on the teachings herein that by using the above-described filters in pairs wherein the lower pass-band frequency filter has its steeper transition skirt on the higher frequency side of the pass-band, and the higher pass-band frequency filter has its steeper transition skirt on the lower frequency side, of its pass-band, that a radio of improved performance can be obtained. These filter pairs can be constructed on the same or different substrates.

We claim:

1. A method for making a SAW filter having asymmetric frequency characteristics, said method comprising steps of:

forming on a substrate a combination of series coupled and parallel coupled SAW resonators; and disposing a dielectric layer on a portion of either but not both of said series and parallel coupled SAW resonators.

2. A method as claimed in claim 1, wherein said step of forming includes a step of forming, on a substrate chosen from a group consisting of lithium niobate, lithium tantalate or quartz, a combination of series coupled and parallel coupled SAW resonators.

3. A method as claimed in claim 2, wherein said step of disposing includes a step of disposing a dielectric layer chosen from a group consisting of silicon dioxide or monoxide, titanium dioxide, aluminum oxide ($Al_2O_3$), magnesium oxide, silicon nitride, tantalum oxide, zinc oxide and II-VI compounds on said portion of either but not both of said series and parallel coupled SAW resonators.

4. A method as claimed in claim 1, wherein said step of disposing includes a step of disposing a dielectric layer chosen from a group consisting of silicon dioxide or monoxide, titanium dioxide, aluminum oxide ($Al_2O_3$), magnesium oxide, silicon nitride, tantalum oxide, zinc oxide and II-VI compounds on said portion of either but not both of said series and parallel coupled SAW resonators.

5. A SAW filter manufactured by the method of claim 3.

6. A method for making a SAW filter, and a SAW filter made by said method, said method comprising steps of:

forming, on a substrate chosen from a group consisting of lithium niobate, lithium tantalate or quartz, a combination of series coupled and parallel coupled SAW resonators; and disposing a dielectric layer chosen from a group consisting of silicon dioxide or monoxide, titanium dioxide, aluminum oxide ($Al_2O_3$), magnesium oxide, silicon nitride, tantalum oxide, zinc oxide and II-VI compounds on a portion of either but not both of said series and parallel coupled SAW resonators.

\* \* \* \* \*